United States Patent
Watanabe (10) Patent No.: US 8,111,844 B2
(45) Date of Patent: Feb. 7, 2012

(54) SEMICONDUCTOR INTEGRATED CIRCUIT AND CONDENSER MICROPHONE

(75) Inventor: Daisuke Watanabe, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 527 days.

(21) Appl. No.: 12/392,625

(22) Filed: Feb. 25, 2009

(65) Prior Publication Data

US 2009/0268926 A1    Oct. 29, 2009

(30) Foreign Application Priority Data

Mar. 17, 2008 (JP) ................... 2008-067312

(51) Int. Cl.
*H04R 3/00* (2006.01)
*H04R 25/00* (2006.01)
*H03R 5/00* (2006.01)
*H03F 99/00* (2009.01)

(52) U.S. Cl. .......... 381/111; 381/113; 381/28; 381/120; 381/174

(58) Field of Classification Search ............. 381/111, 381/113, 28, 120, 174
See application file for complete search history.

(56) References Cited

U.S. PATENT DOCUMENTS

| | | | | |
|---|---|---|---|---|
| 5,589,799 | A  * | 12/1996 | Madaffari et al. | 330/277 |
| 6,160,450 | A  * | 12/2000 | Eschauzier et al. | 330/253 |
| 6,218,883 | B1 * | 4/2001  | Takeuchi | 327/318 |
| 6,453,048 | B1 * | 9/2002  | Akino | 381/113 |
| 6,516,069 | B1 * | 2/2003  | Takeuchi et al. | 381/122 |
| 6,978,029 | B1 * | 12/2005 | Ikeda | 381/111 |
| 7,110,560 | B2 * | 9/2006  | Stenberg | 381/113 |
| 7,702,118 | B2 * | 4/2010  | Park et al. | 381/113 |
| 7,787,642 | B2 * | 8/2010  | Baker et al. | 381/113 |
| 7,899,196 | B2 * | 3/2011  | Furst et al. | 381/111 |
| 2003/0228848 | A1 * | 12/2003 | Escoffier et al. | 455/91 |
| 2005/0089180 | A1 * | 4/2005  | Saeki et al. | 381/174 |
| 2007/0217628 | A1 * | 9/2007  | Boor | 381/111 |

FOREIGN PATENT DOCUMENTS

JP        3081106 U      8/2001

* cited by examiner

*Primary Examiner* — Luan C Thai
(74) *Attorney, Agent, or Firm* — Sughrue Mion, PLLC (57) ABSTRACT

A semiconductor integrated circuit for a condenser microphone according to one exemplary aspect of the present invention includes a first resistor, a second resistor, a power supply terminal, a first capacitor, and a first diode. The first resistor and the second resistor are connected between a drain of an output transistor and an output terminal in series. The power supply terminal is connected to a source of the output transistor. The first capacitor is arranged between the power supply terminal and a connection point of the first resistor and the second resistor. The first diode is connected in parallel with the first capacitor.

8 Claims, 9 Drawing Sheets

SEMICONDUCTOR INTEGRATED CIRCUIT AND CONDENSER MICROPHONE

BACKGROUND

1. Field of the Invention

The present invention relates to a semiconductor integrated circuit and a condenser microphone, and more specifically, to a semiconductor integrated circuit mounted on a condenser microphone, and a condenser microphone using the semiconductor integrated circuit.

2. Description of Related Art

Recently, in condenser microphones, the component mounting areas have been decreasing in accordance with the miniaturization of microphones. Because of this, it has been desired to decrease the number of components to be mounted and to integrate capacitors for cutting high frequencies. However, there is caused a problem that the ESD withstand voltage decreases by integrating the capacitors. In general, the withstand voltage of 8 kV is required in a microphone in ESD test (IEC61000-4-2). Thus, it is desired to integrate the capacitor while securing the ESD withstand voltage of the microphone.

Figure 9:
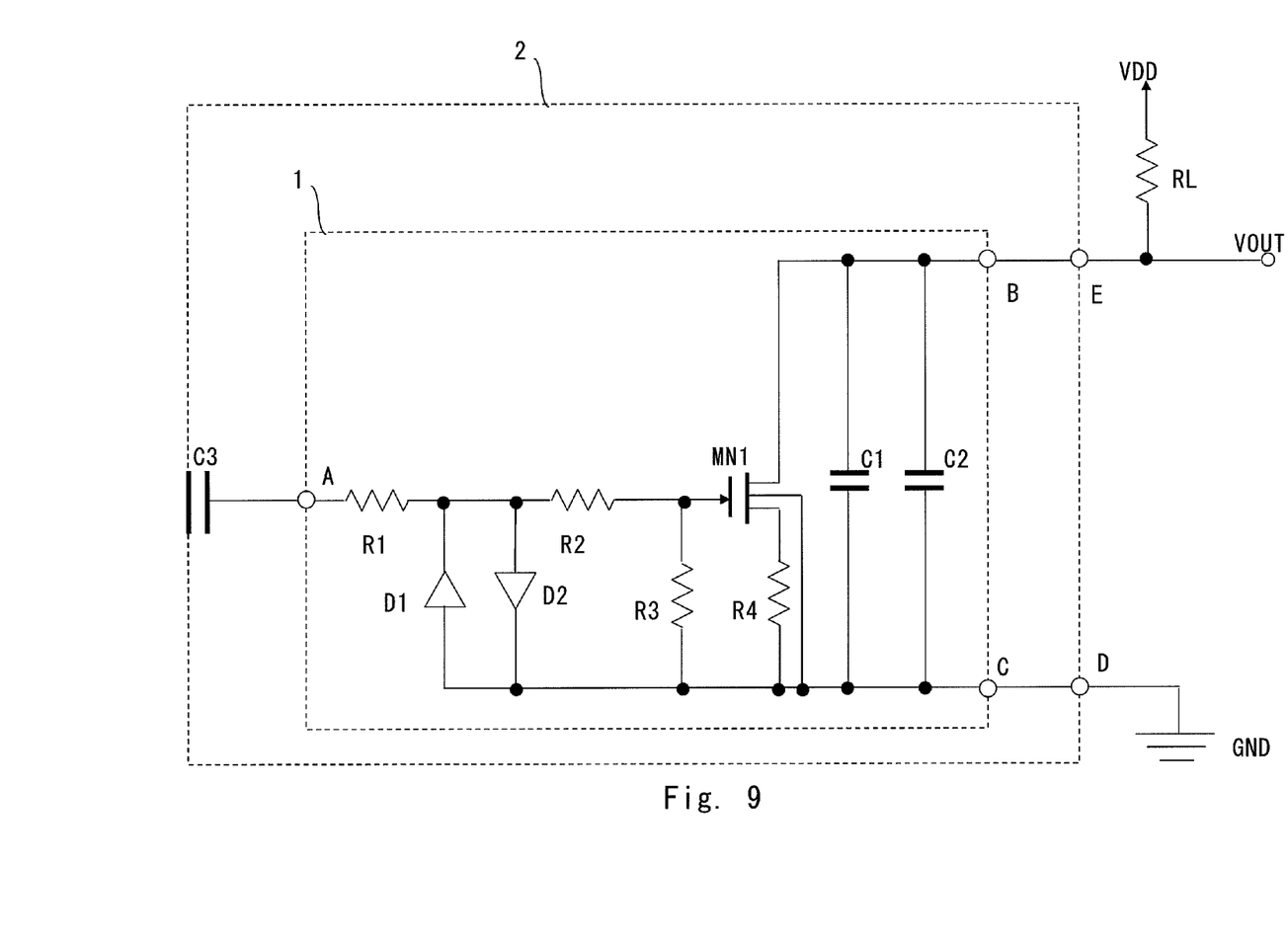
FIG. 9 shows a configuration of a related condenser microphone.

FIG. 9 shows a configuration of a related example disclosed in Japanese Registered Utility Model No. 3081106 (Chin). In FIG. 9, a terminal A is a device input terminal having one end connected to a gate of an output transistor MN1 through resistors R1 and R2 and the other end connected to a diaphragm C3 of a condenser microphone 2. A terminal B is an output/power supply terminal that functions both as a power supply terminal and an output terminal. One end of the terminal B is connected to a drain of the output transistor MN1, and the other end of the terminal B is connected to a terminal E of the condenser microphone 2. A terminal E is connected to a power supply VDD through a load resistor RL. Further, the terminal E is connected to an output terminal VOUT of an AC signal.

The resistors R1 and R2 and diodes D1 and D2 in the device are protection circuits, and may be eliminated if they are not needed. Further, a resistor R3 is a pull-down resistor for determining an input impedance of the device, and is normally from several hundreds of MΩ to several tens of GΩ. A resistor R4 is a source resistor which is used for gain adjustment. The resistor R4 may be eliminated when it is not needed.

The voltage input to the diaphragm C3 of the condenser microphone 2 is input to the gate of the output transistor MN1. Then, after being subjected to current amplification, the voltage is output from the output terminal VOUT. Thus, the input signal is amplified and impedance conversion is performed. Between the terminal B and the drain of the output transistor MN1, capacitors C1 and C2 are provided as ground capacitors in order to remove the RF noise (800 MH to 2 GHz). These capacitors C1, C2 function as filters for the RF signal to decrease the RF noise.

In the related example disclosed in Chin, the capacitors C1 are C2 are integrated to realize miniaturization. In the related example, capacitances of 10 pF and 33 pF are employed as the capacitors C1 and C2. However, in general, it is difficult to increase the size of the capacitors integrated in the semiconductor. When the capacitances of 10 pF and 33 pF are employed, the chip size becomes large.

Although it is possible to decrease the chip with the capacitive element having large unit capacitance such as a gate capacitance, the capacitive element tends to be highly susceptible to ESD when the unit capacitance becomes larger, which means it is difficult to accomplish the desired ESD level. Integrating the capacitors for the miniaturization of the microphone and the ESD resistance conflict with each other, and it is difficult to realize both of them with the related circuit.

SUMMARY

The present inventors have found a problem that it is difficult to integrate the capacitor to decrease the chip size, and to realize the high ESD withstand voltage.

A first exemplary aspect of an embodiment of the present invention is a semiconductor integrated circuit for a condenser microphone, the semiconductor integrated circuit including a first resistor, a second resistor, a power supply terminal, a first capacitor, and a first diode. The first resistor and the second resistor are connected between a drain of an output transistor and an output terminal in series. The power supply terminal is connected to a source of the output transistor. The first capacitor is arranged between the power supply terminal and a connection point of the first resistor and the second resistor. The first diode is connected in parallel with the first capacitor.

As stated above, a set of the first capacitor and the first diode is arranged as a part of the protection circuit between the power supply terminal and the connection point of the first resistor and the second resistor. Accordingly, the high-frequency component of the ESD current is discharged through the first capacitor, and the low-frequency component is discharged through the first diode.

Further, the first resistor and the second resistor are provided to be symmetrical with respect to the first capacitor and the first diode. By providing the first resistor in the output transistor side of the first capacitor and the first diode, the impedance of the internal circuit side can be made higher compared with the first capacitor and the first diode, whereby the internal circuit can be protected from the ESD current.

Further, by providing the second resistor in the output terminal side of the first capacitor and the first diode, the time constant of the whole circuit is increased and the ESD discharge time can be made longer, whereby it is possible to protect the whole circuit from the breakdown due to the overcurrent. Furthermore, the first resistor, the second resistor, the first capacitor, and the first diode form a T-type low-pass filter. Accordingly, it is possible to remove the RF noise of the power supply, and to realize the semiconductor integrated circuit for condenser microphone with low noise and high ESD withstand voltage.

According to the present invention, it is possible to provide a semiconductor integrated circuit and a condenser microphone which enable to integrate a capacitor and to realize the high ESD withstand voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
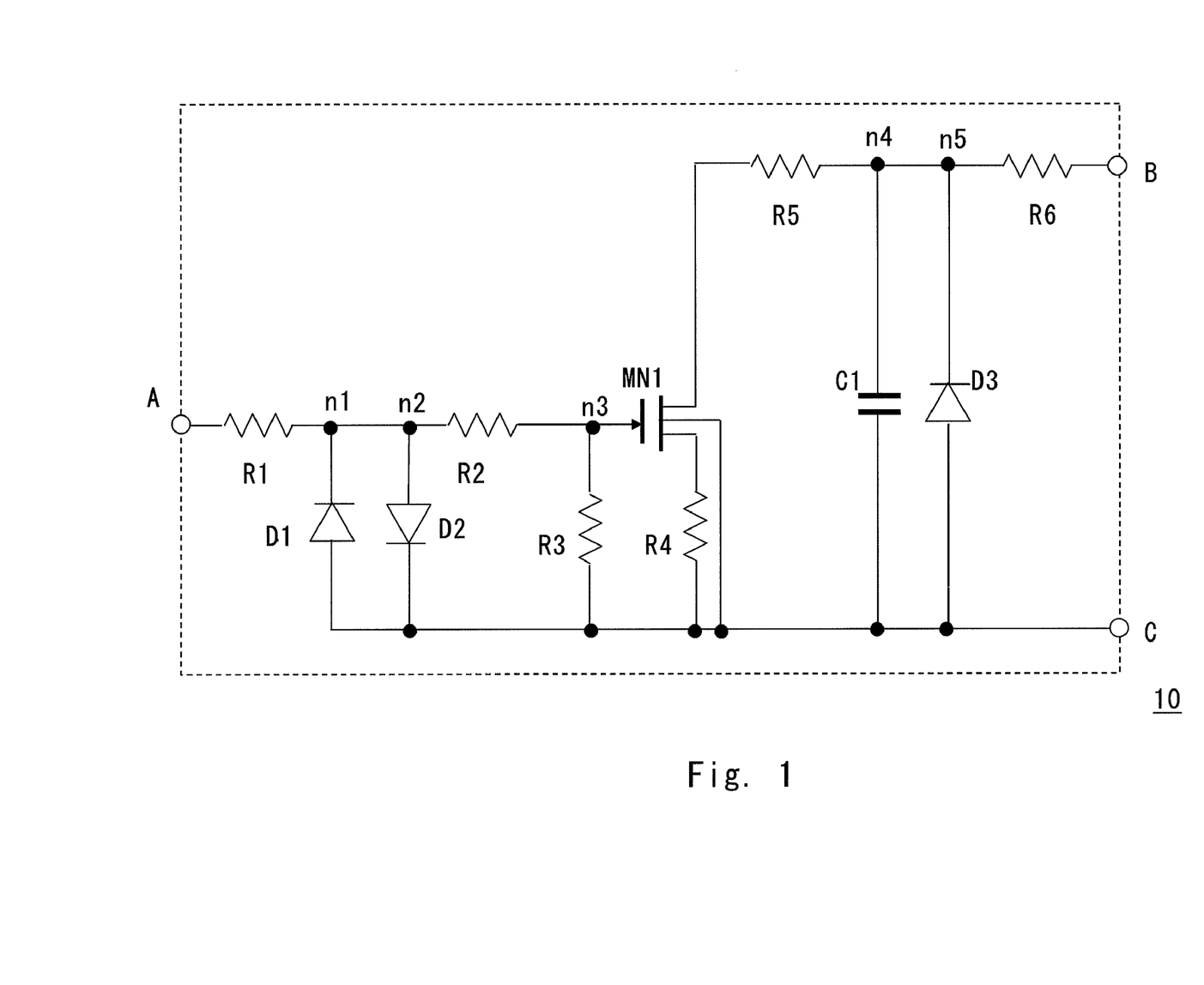
FIG. 1 shows a configuration of a semiconductor integrated circuit according to a first exemplary embodiment.
Figure 2:
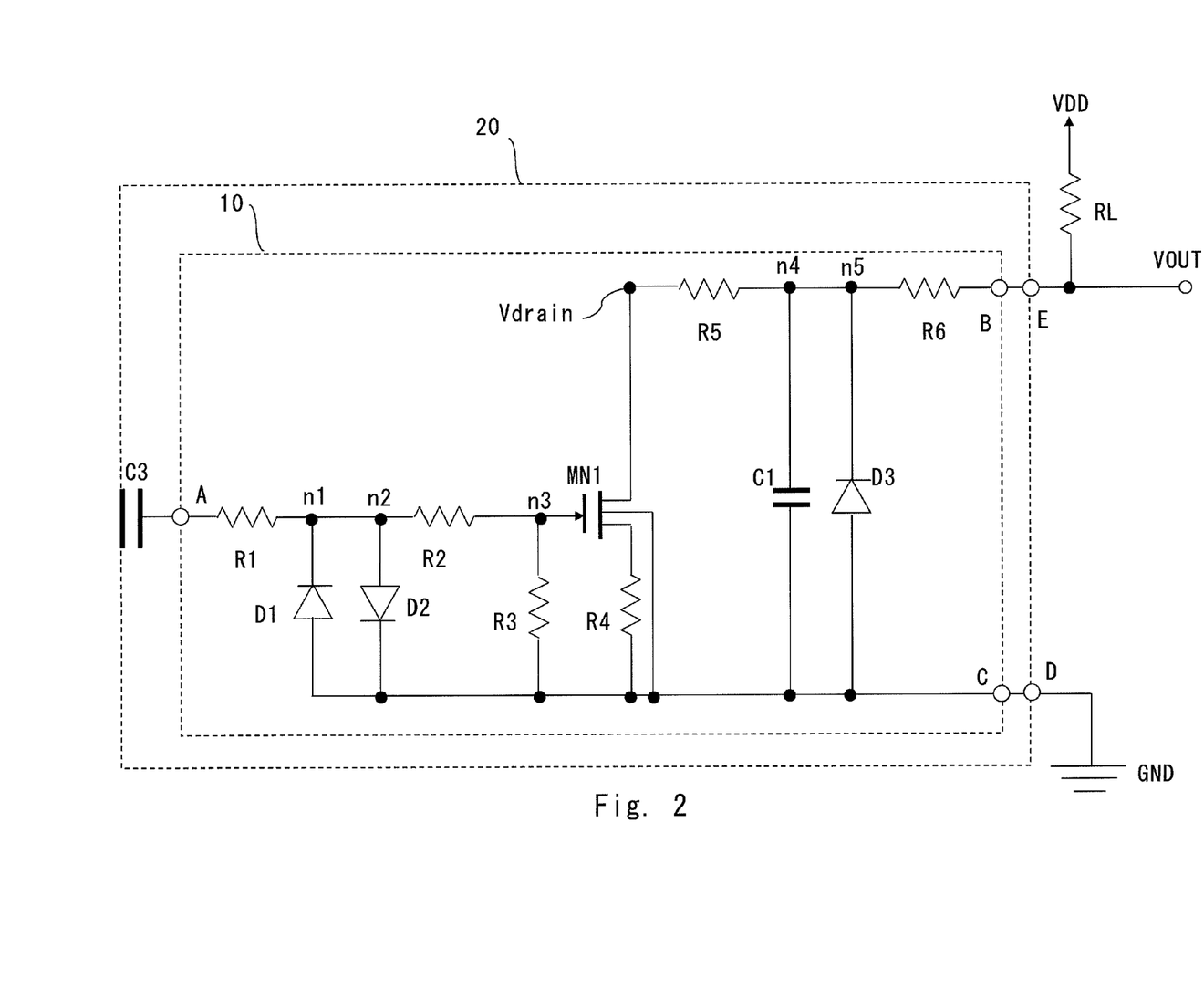
FIG. 2 shows a configuration of a condenser microphone using the semiconductor integrated circuit according to the first exemplary embodiment.

Referring to FIGS. 1 and 2, a condenser microphone using a semiconductor integrated circuit according to a first exemplary embodiment of the present invention will be described. FIG. 1 shows a configuration of a semiconductor integrated circuit 10 according to the first exemplary embodiment. FIG. 2 shows a configuration of a condenser microphone 20 using the semiconductor integrated circuit 10 shown in FIG. 1. As shown in FIG. 1, the semiconductor integrated circuit 10 according to the first exemplary embodiment includes an output transistor MN1, a capacitor C1, diodes D1, D2, D3, and resistors R1, R2, R3, R4, R5, R6.

As shown in FIG. 2, a terminal A, which is an input terminal of the semiconductor integrated circuit 10, is connected to a diaphragm C3 of the condenser microphone 20. A terminal B is connected to a terminal E of the condenser microphone 20. In the first exemplary embodiment, the terminal B is a power supply/output terminal that functions both as a power supply terminal and an output terminal. The terminal E is connected to a power supply VDD through a load resistor RL. Further, the terminal E is connected to an output terminal VOUT of an AC signal.

A terminal C is connected to a terminal D of the condenser microphone 20, and the terminal D is connected to a ground power supply GND. The terminal C is a power supply terminal connected to the ground power supply GND. As stated above, no external element is needed except the load resistor RL in the present invention. Accordingly, it is possible to realize miniaturization of the condenser microphone 20.

As shown in FIG. 1, the resistors R1 and R2 are connected in series between the terminal A of the semiconductor integrated circuit 10 and a gate of the output transistor MN1. An FET (field effect transistor) is employed, for example, as the output transistor MN1. A diode D1 is provided in reverse direction between the connection point n1 of the resistors R1 and R2 and the terminal C. Further, the diode D2 is provided in forward direction between the connection point n2 of the resistors R1 and R2 and the terminal C. Note that the resistors R1, R2 and the diodes D1, D2 are protection circuits, and may be eliminated when they are not necessary.

The resistor R3 is provided between the terminal C and the connection point n3 of the resistor R2 and the gate of the output transistor MN1. The resistor R3 is a pull-down resistor for determining the input impedance of the device, and is usually from several hundreds of MΩ to several tens of GΩ. Further, a source of the output transistor MN1 is connected to the terminal C through the resistor R4. The resistor R4 is a source resistor which is used for gain adjustment. Note that the resistor R4 may be eliminated when it is not necessary. Further, a back gate of the output transistor MN1 is connected to the terminal C.

A drain of the output transistor MN1 is connected to the terminal B through the resistors R5, R6. The resistors R5 and R6 are connected in series. A diffused resistor, a polysilicon resistor or the like may be employed as the resistors R5 and R6. The capacitor C1 is provided between the connection point n4 of the resistors R5 and R6 and the terminal C connected to the ground power supply GND. A MOS capacitor, a MIN capacitor, a MIP (metal-insulator-polysilicon) capacitor or the like is employed as the capacitor C1.

Further, the diode D3 is connected in the reverse direction between the connection point n5 of the resistors R5 and R6 and the terminal C connected to the ground power supply GND. In other words, the diode D3 is connected in parallel with the capacitor C1. A PN junction diode, or P-MOS or N-MOS may be employed as the diode D3.

The voltage input to the diaphragm C3 of the condenser microphone 20 is input to the gate of the output transistor MN1. Then, after being subjected to current amplification, the voltage is output from the output terminal VOUT. Accordingly, it is possible to amplify the input signal and perform impedance conversion.

In the semiconductor integrated circuit 10 according to the first exemplary embodiment, a set of the capacitor C1 and the diode D3 is provided as a part of the ESD protection circuit between the connection point of the resistors R5 and R6 and the terminal C connected to the ground power supply GND. Thus, the high-frequency component of the ESD current is supplied to the ground power supply GND through the capacitor C1, and the low-frequency component is supplied to the ground power supply GND through the diode D3.

Further, in the semiconductor integrated circuit 10, the resistors R5 and R6 are provided to be symmetrical with respect to the capacitor C1 and the diode D3. In summary, the resistor R5 is provided in the output transistor MN1 side of the connection point n4 to which the capacitor C1 is connected, and the resistor R6 is provided in the terminal B side of the connection point n5 to which the diode D3 is connected.

By providing the resistor R5 in the output transistor MN1 side of the connection point n4, the impedance in the internal circuit side can be made higher compared with the capacitor and the diode. Accordingly, it is possible to protect the internal circuit from the ESD current. Further, by providing the resistor R6 in the terminal B side connected to the power supply VDD of the connection point n5, it is possible to increase the time constant of the pulse current of ESD and to increase the discharge time. Accordingly, the breakdown of the capacitor C1 and the diode D3 such as burnout due to the overcurrent can be prevented.

Further, these two resistors R5, R6, the capacitor C1, and the diode D3 also function as a T-type low-pass filter. As such, the signal from 800 MHz to 2 GHz can be attenuated in a relatively easy way, and the RF noise of the power supply VDD (800 MHz to 2 GHz) can be removed. On the other hand, the degradation against the signal up to 20 kHz which is the audio signal is not caused. Accordingly, the condenser microphone 20 with low noise and high ESD withstand voltage can be realized.

Figure 3:
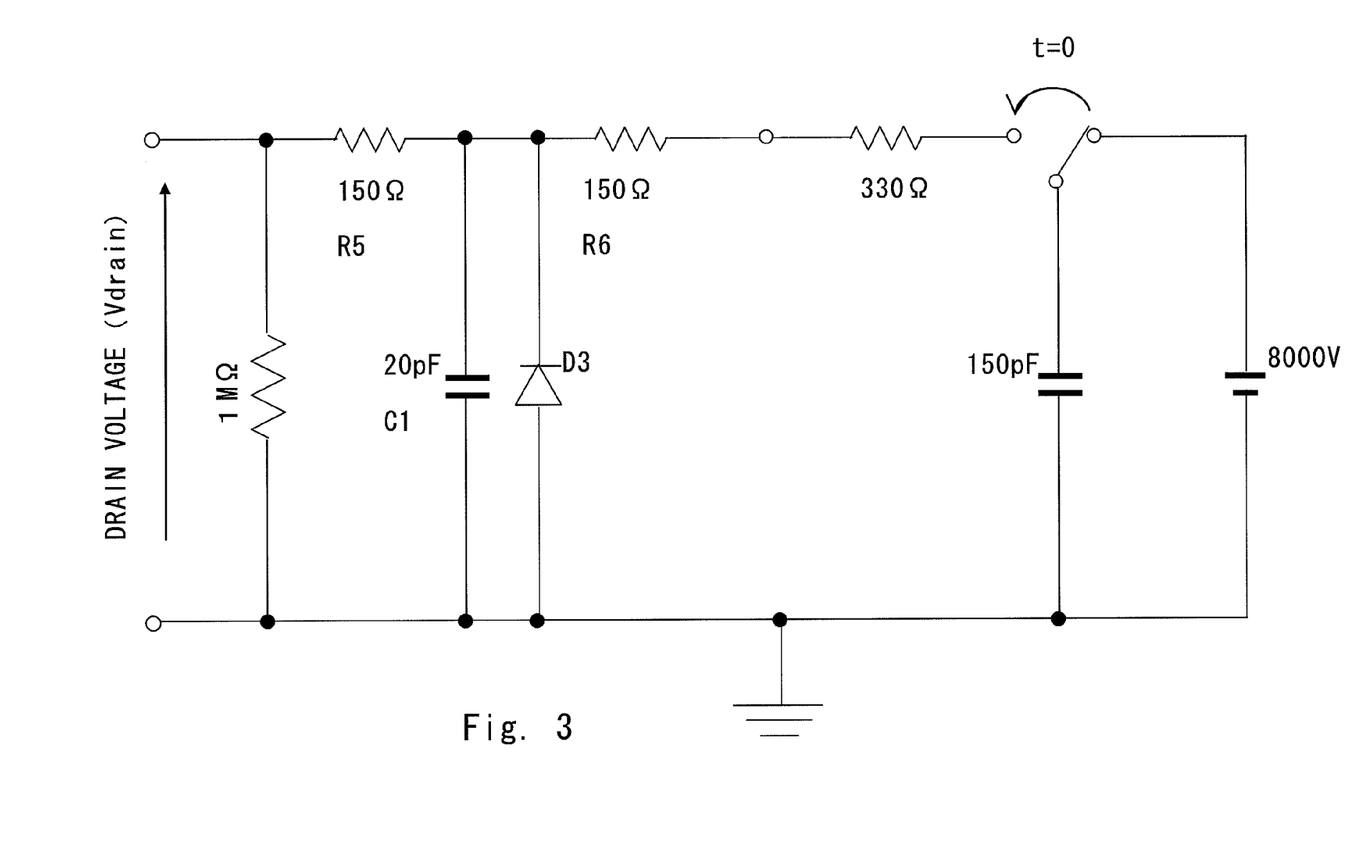
FIG. 3 shows a configuration of the semiconductor integrated circuit according to the first exemplary embodiment in which an ESD simulation is conducted.

Now, the simulation using the circuit according to the first exemplary embodiment shown in FIG. 3 will be described. As shown in FIG. 3, the simulation of the ESD withstand voltage is performed on the circuit with the resistors R5=R6=150 Ω, the capacitor C1=20 pF, and the diode D3 in which breakdown voltage is 8 V and ON resistance in breaking is 0.2 Ω. In this example, the drain voltage (Vdrain) applied to the drain terminal in 8 kV is simulated in ESD test IEC61000-4-2. Further, the output resistor of 1 MΩ, which is large enough compared with the output resistor used in the condenser microphone, is used as the load resistor.

Figure 4:
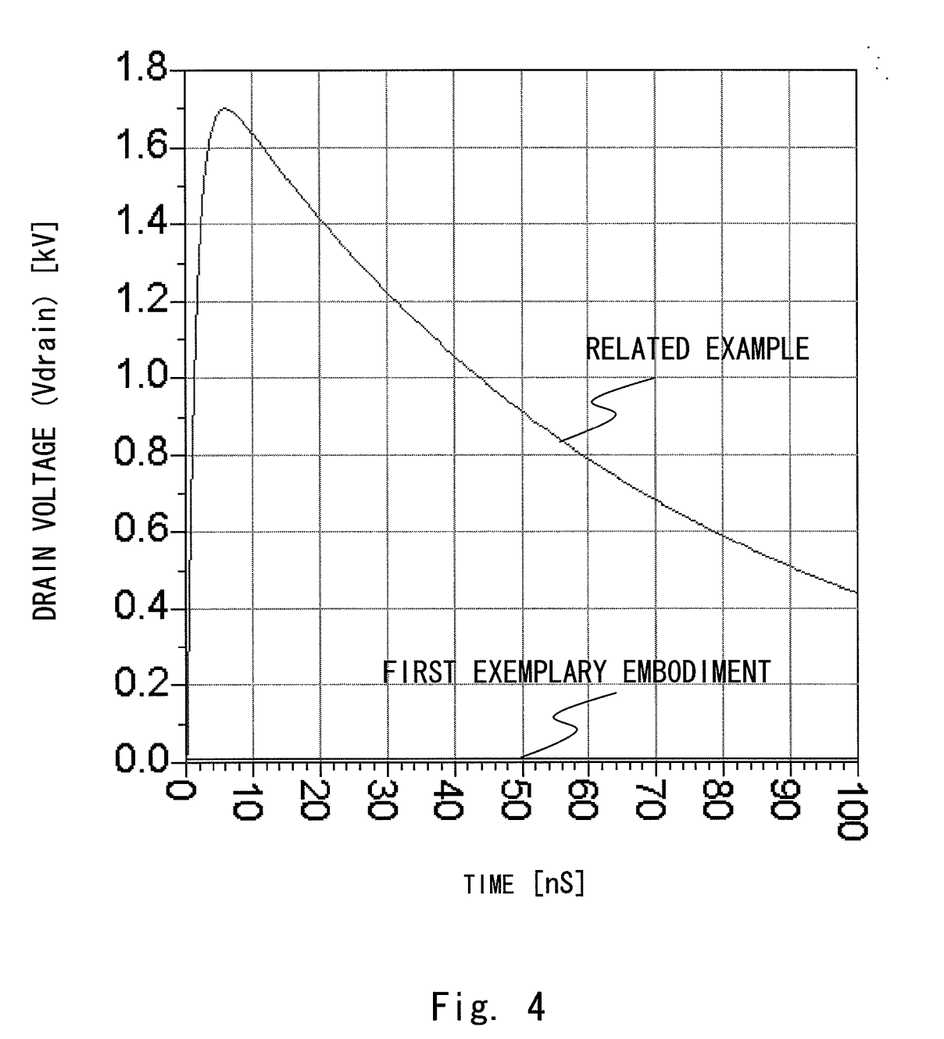
FIG. 4 is a graph showing a simulation result of the ESD of the semiconductor integrated circuit shown in FIG. 3.

FIG. 4 shows the simulation result. The same simulation is performed on a related circuit that only includes a capacitor for the purpose of comparison. As shown in FIG. 4, in the related circuit that only includes the capacitor, the peak voltage is about 1.7 kV, and this voltage is applied to the drain end and the capacitor end. Thus, it is readily estimated that the ESD withstand voltage is low in the related circuit.

On the other hand, in the circuit according to the first exemplary embodiment, the peak voltage is 12 V, and the voltage applied to the drain end and the capacitor end is greatly reduced. Thus, the ESD characteristics is greatly improved. The peak current is determined by a parasitic resistance and the breakdown voltage of the diode. By designing these values to be smaller, the peak voltage applied to the drain end and the capacitor end can further be made lower.

Figure 5:
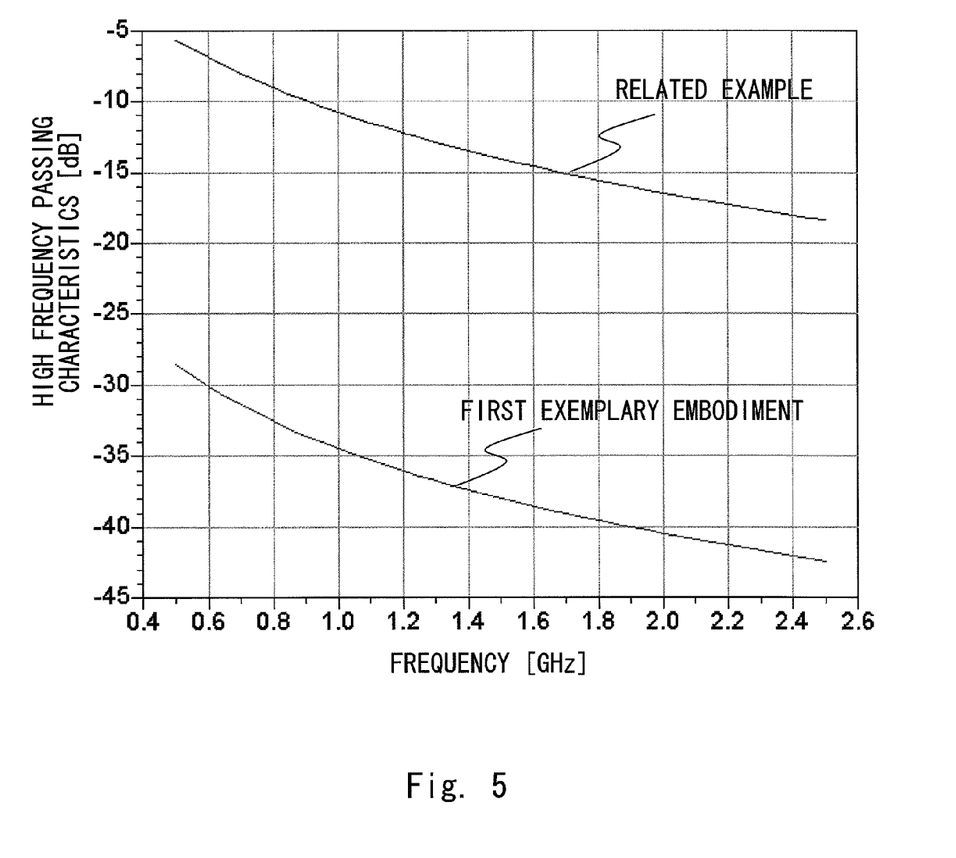
FIG. 5 is a graph showing a simulation result of high frequency passing characteristics of the semiconductor integrated circuit shown in FIG. 3.

FIG. 5 shows a simulation result of high frequency passing characteristics. As shown in FIG. 5, in the related art, −8 dB in 800 MHz, and −17 dB in 2 GHz. On the other hand, in the circuit according to the first exemplary embodiment, −33 dB in 800 MHz, and −40 dB in 2 GHz, which means that the present invention is effective in removing the high frequency noise as well.

In the related circuit, incorporating the capacitor for reducing the RF noise is difficult to be realized as it leads to increase of the chip area and the degradation of the ESD withstand voltage. However, by using the semiconductor integrated circuit 10 according to the present invention, it is possible to decrease the RF noise while keeping the high ESD withstand voltage, and to integrate the elements which are externally provided in the related art.

Second Exemplary Embodiment

Figure 6:
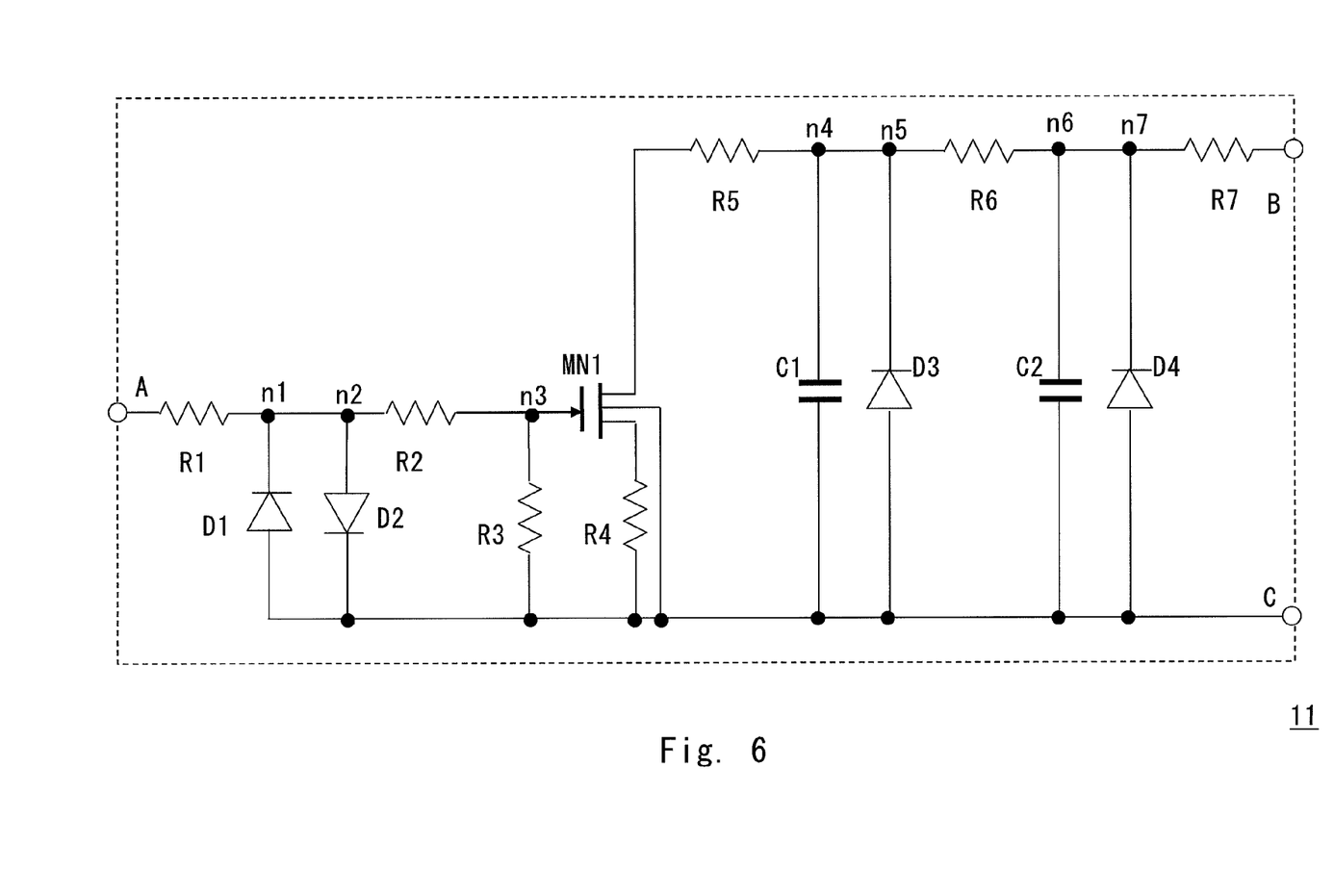
FIG. 6 shows a configuration of a semiconductor integrated circuit according to a second exemplary embodiment.

A semiconductor integrated circuit 11 according to a second exemplary embodiment of the present invention will be described with reference to FIG. 6. FIG. 6 shows a configuration of the semiconductor integrated circuit 11 according to the second exemplary embodiment. In FIG. 6, the same components as those of FIG. 1 are denoted by the same reference symbols, and the overlapping description will be omitted as appropriate.

As shown in FIG. 6, in the semiconductor integrated circuit 11 according to the second exemplary embodiment, the drain of the output transistor MN1 is connected to the terminal B through resistors R5, R6, and R7. The resistors R5, R6, and R7 are connected in series. The capacitor C1 is connected between the connection point n4 of the resistors R5 and R6 and the terminal C. Further, the diode D3 is connected in the reverse direction between the connection point n5 of the resistors R5 and R6 and the terminal C. In summary, the diode D3 is connected in parallel with the capacitor C1.

Further, a capacitor C2 is provided between the connection point n6 of the resistors R6 and R7 and the terminal C. Further, a diode D4 is connected in the reverse direction between the connection point n7 of the resistors R6 and R7 and the terminal C. In summary, the diode D4 is connected in parallel with the capacitor C2. As shown in FIG. 2, the terminal C is connected to the ground power supply GND through the terminal D of the condenser microphone 20.

As described above, in the semiconductor integrated circuit 10 according to the second exemplary embodiment, a set of the capacitor C1 and the diode D3 is provided as a part of the ESD protection circuit between the connection point of the resistors R5 and R6, and the terminal C connected to the ground power supply GND. Further, a set of the capacitor C2 and the diode D4 is provided between the connection point of the resistors R6 and R7, and the terminal C connected to the ground power supply GND. As stated above, it is possible to improve the passing characteristics of the RF noise by forming the set of the capacitor and the diode in two stages.

Figure 7:
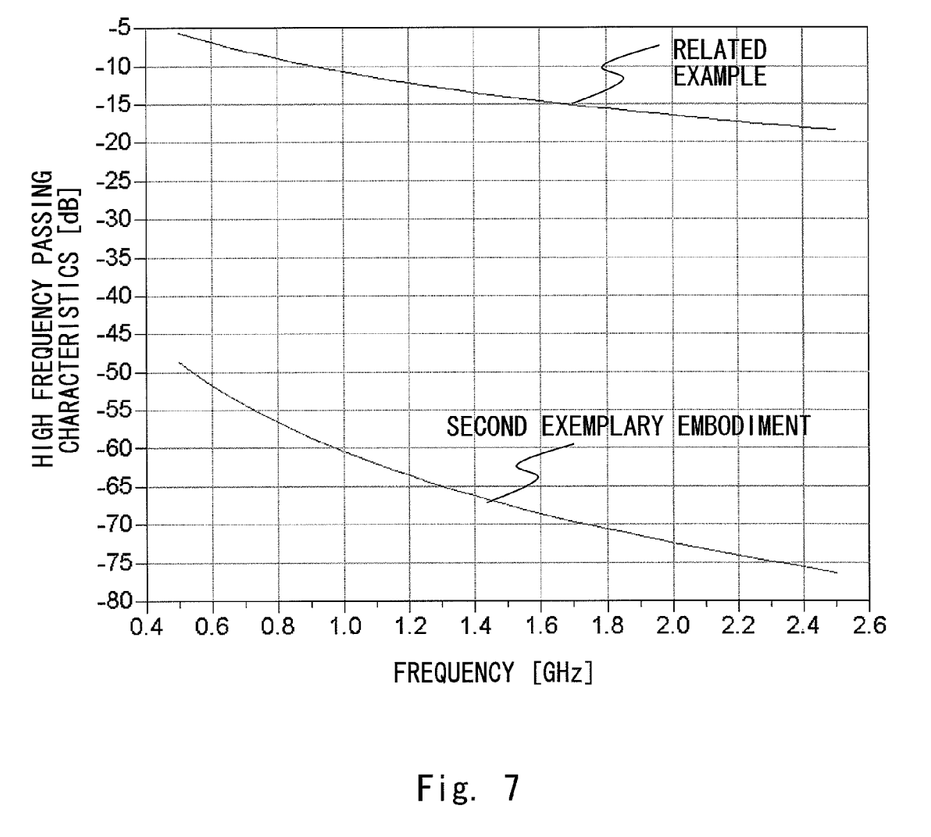
FIG. 7 is a graph showing a simulation result of high frequency passing characteristics of the semiconductor integrated circuit according to the second exemplary embodiment.

FIG. 7 shows a simulation result of the high frequency passing characteristics when the circuit according to the second exemplary embodiment is employed. As shown in FIG. 7, in the related art, −8 dB in 800 MHz, and −17 dB in 2 GHz. On the other hand, according to the circuit of the second exemplary embodiment, −52 dB in 800 MHz, and −72 dB in 2 GHz, which means that the high frequency noise can further be removed.

Further, by forming the set of the capacitor and the diode in two stages, the peak voltage by ESD is reduced to 8 V, which is substantially equal to the breakdown voltage of the diodes D3 and D4, whereby the ESD protection ability can further be enhanced. From the above description, it is possible to realize high ESD withstand voltage and low RF noise.

Third Exemplary Embodiment

Figure 8:
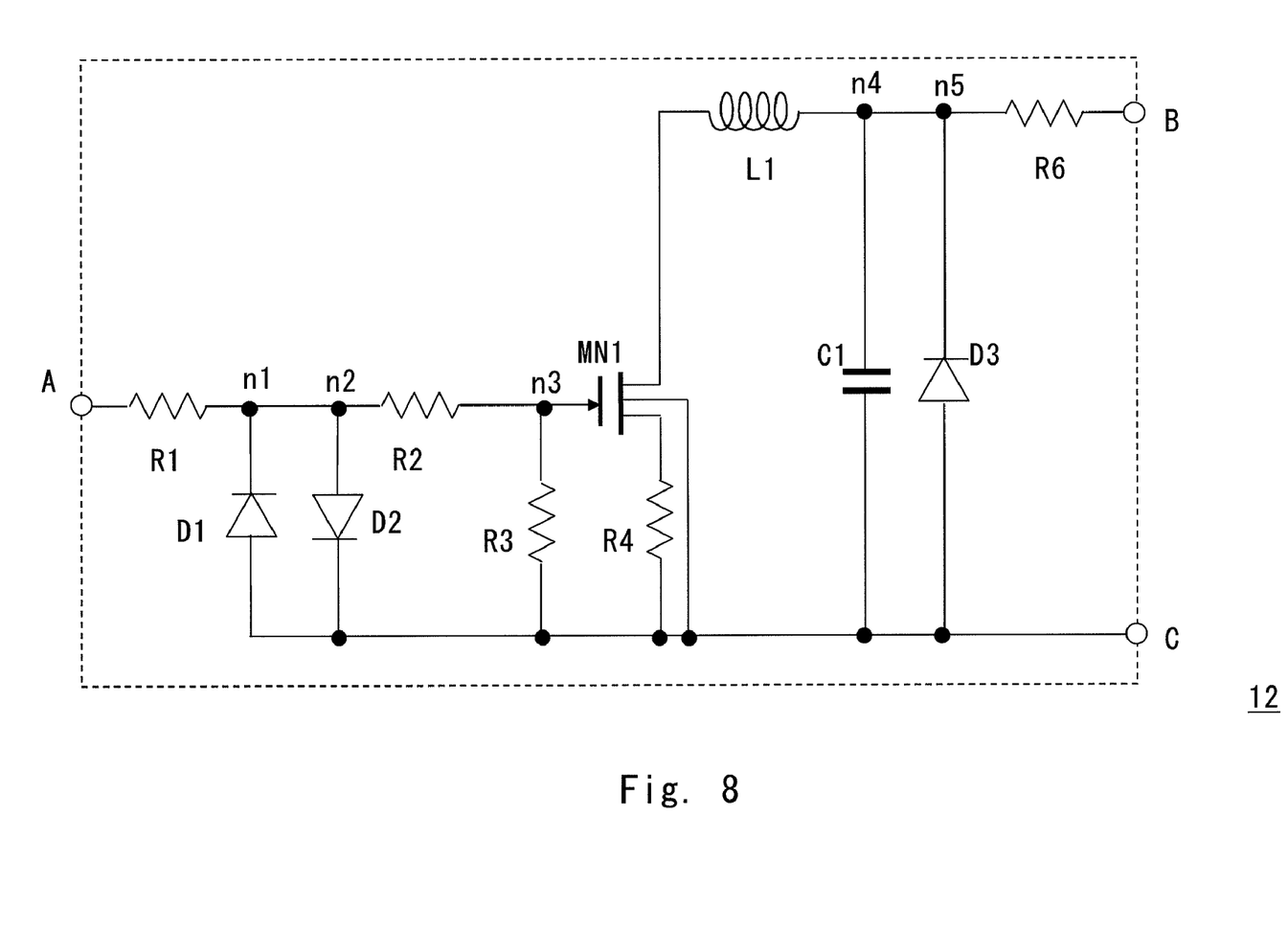
FIG. 8 shows a configuration of a semiconductor integrated circuit according to a third exemplary embodiment.

A semiconductor integrated circuit 12 according to the third exemplary embodiment of the present invention will be described with reference to FIG. 8. FIG. 8 shows the configuration of the semiconductor integrated circuit 12 according to the third exemplary embodiment. In FIG. 8, the same components as those of FIG. 1 are denoted by the same reference symbols, and the overlapping description will be omitted as appropriate.

As shown in FIG. 8, the semiconductor integrated circuit 12 according to the third exemplary embodiment includes an inductance L1 instead of the resistor R5 shown in FIG. 1. Thus, it is possible to realize the same effect as that of the first exemplary embodiment even when the inductance L1 is provided between the gate of the output transistor MN1 and the connection point n4. A spiral inductor may be employed as the inductance L1, for example. The inductance L1 is designed so that the wiring resistance is as high as that of the resistor R5. As the inductance L1 functions as the metal resistor, the impedance can be made high due to the same principle as the resistor R5, whereby the internal circuit can be protected from the ESD current.

Further, as the inductance L1 has a low Q value for the high-frequency component of the noise, there is caused dielectric loss. As a result, the passing characteristics in 800 MHz to 2 GHz is degraded, whereby it is possible to remove the RF noise and to realize the condenser microphone with lower noise.

As described above, according to the present invention, in the semiconductor integrated circuit for the condenser microphone, it is possible to realize the miniaturization of the condenser microphone by incorporating the capacitor and to realize the high ESD withstand voltage.

The first, second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit for a condenser microphone, the semiconductor integrated circuit comprising:
    a first resistor and a second resistor connected between a drain of an output transistor and an output terminal in series;
    a power supply terminal connected to a source of the output transistor;
    a first capacitor arranged between the power supply terminal and a connection point of the first resistor and the second resistor; and
    a first diode connected in parallel with the first capacitor.

2. The semiconductor integrated circuit according to claim 1, further comprising:
    a third resistor connected between the second resistor and the output terminal in series;
    a second capacitor arranged between the power supply terminal and a connection point of the second resistor and the third resistor; and
    a second diode connected in parallel with the second capacitor.

3. The semiconductor integrated circuit according to claim 1, wherein
    the first resistor is formed of a spiral inductor.

4. The semiconductor integrated circuit according to claim 2, wherein
    the first resistor is formed of a spiral inductor.

5. A condenser microphone, comprising:
    a semiconductor integrated circuit according to claim 1; and
    a diaphragm connected to a gate of the output transistor.

6. A condenser microphone, comprising:
    a semiconductor integrated circuit according to claim 2; and
    a diaphragm connected to a gate of the output transistor.

7. A condenser microphone, comprising:
    a semiconductor integrated circuit according to claim 3; and
    a diaphragm connected to a gate of the output transistor.

8. A condenser microphone, comprising:
    a semiconductor integrated circuit according to claim 4; and
    a diaphragm connected to a gate of the output transistor.

* * * * *